US010310278B2

(12) United States Patent
Jiang et al.

(10) Patent No.: US 10,310,278 B2
(45) Date of Patent: Jun. 4, 2019

(54) SEMICONDUCTOR LASER

(71) Applicant: BWT Beijing Ltd., Beijing (CN)

(72) Inventors: Xiaochen Jiang, Beijing (CN); Tie Wang, Beijing (CN); Weirong Guo, Beijing (CN); Baohua Wang, Beijing (CN); Rui Liu, Beijing (CN); Lei Xu, Beijing (CN)

(73) Assignee: BWT Beijing Ltd., Beijing (CN)

( * ) Notice: Subject to any disclaimer, the term of this patent is extended or adjusted under 35 U.S.C. 154(b) by 260 days.

(21) Appl. No.: 15/127,211

(22) PCT Filed: Feb. 6, 2016

(86) PCT No.: PCT/CN2016/073711
§ 371 (c)(1),
(2) Date: Sep. 19, 2016

(87) PCT Pub. No.: WO2017/121000
PCT Pub. Date: Jul. 20, 2017

(65) Prior Publication Data
US 2018/0031850 A1    Feb. 1, 2018

(30) Foreign Application Priority Data
Jan. 11, 2016 (CN) .......................... 2016 1 0015579

(51) Int. Cl.
*G02B 27/10* (2006.01)
*H01S 5/40* (2006.01)
(Continued)

(52) U.S. Cl.
CPC ......... *G02B 27/10* (2013.01); *G02B 19/0019* (2013.01); *G02B 19/0057* (2013.01);
(Continued)

(58) Field of Classification Search
CPC ................ G02B 27/10; G02B 27/0905; G02B 27/0911; G02B 27/0922; G02B 19/0019;
(Continued)

(56) References Cited

U.S. PATENT DOCUMENTS

2009/0245315 A1    10/2009    Faybishenko
2013/0148684 A1     6/2013    Guo
2015/0280404 A1    10/2015    Kasai

FOREIGN PATENT DOCUMENTS

CN       102401949     *    4/2012
CN       102401949 A        4/2012
(Continued)

OTHER PUBLICATIONS

Chinese Office Action dated Oct. 27, 2017 for CN Application No. 201610015579.8, 12 pages.
(Continued)

*Primary Examiner* — Armando Rodriguez
(74) *Attorney, Agent, or Firm* — Arch & Lake LLP

(57) ABSTRACT

The present invention belongs to the field of laser technology, particularly relates to a semiconductor laser, including a substrate, and lasers, fast axis collimation components, slow axis collimation components, steering compression optical systems, a polarization beam combination prism, a focusing lens and an optical fiber provided on the substrate, wherein the lasers can be arranged in two rows or one row. And lasers of the same row are all located in a same plane. Each laser is sequentially provided with a fast axis collimation component and a slow axis collimation component in the direction of an optical path. The lasers of the same row correspond to a group of steering compression optical systems used to steer and compress the light beams collimated by the fast axis collimation components and the slow axis collimation components. The polarization beam combination prism is used for combining two beams of lasers having (Continued)

been steered and compressed by two groups of the steering compression optical systems. And the laser combined by the polarization beam combination prism is coupled into the optical fiber by the focusing lens. The present invention has a compact structure and a simple optical path, effectively reduces the thickness of the substrate and improves the thermal dissipation capacity of the laser, so that the efficiency and reliability of the laser are improved.

10 Claims, 7 Drawing Sheets

(51) Int. Cl.
*H01S 5/00* (2006.01)
*G02B 19/00* (2006.01)
*G02B 27/09* (2006.01)

(52) U.S. Cl.
CPC ...... *G02B 27/0905* (2013.01); *G02B 27/0911* (2013.01); *G02B 27/0922* (2013.01); *H01S 5/0071* (2013.01); *H01S 5/40* (2013.01); *H01S 5/4012* (2013.01); *H01S 5/4025* (2013.01); *H01S 5/405* (2013.01)

(58) Field of Classification Search
CPC ..... G02B 19/0057; H01S 5/0071; H01S 5/40; H01S 5/4012; H01S 5/4025; H01S 5/405
See application file for complete search history.

(56) References Cited

FOREIGN PATENT DOCUMENTS

| | | |
|---|---|---|
| CN | 202600259 U | 12/2012 |
| CN | 202995141 U | 6/2013 |
| CN | 104112978 A | 10/2014 |
| CN | 104704410 A | 6/2015 |

OTHER PUBLICATIONS

International Search Report dated Aug. 23, 2016 for PCT/CN2016/073711, 8 pages.

Written Opinion dated Aug. 23, 2016 for PCT/CN2016/073711, 3 pages.

* cited by examiner

SEMICONDUCTOR LASER

CROSS-REFERENCE TO RELATED APPLICATIONS

This application is a National Stage of International Application No. PCT/CN2016/073711, filed on Feb. 6, 2016, which is based upon and claims priority to Chinese Patent Application No. 201610015579.8, filed on Jan. 11, 2016, the entire contents of both of which are incorporated herein by reference.

TECHNICAL FIELD

The present invention belongs to the field of laser technology, particularly relates to a semiconductor laser.

DESCRIPTION OF RELATED ART

Currently, the beam combiner of most of multiple single-emitter semiconductor lasers adopts a stepped structure, in which a substrate is processed to include steps equally spaced and on each of the steps a laser diode chip is mounted, as shown in FIG. 1. This method is of high requirement of precision of the step spacing processing, and of strict requirement of parallelism between the steps, therefore of relatively high processing cost. In the meanwhile, each step has a different thermal dissipation capacity due to the existence of height difference. When increasing the number of single-emitter diode lasers to increase the output power, it is necessary to compress the step spacing. Due to the existence of machining tolerance, it caused negative influence to the assembly and adjustment of an optical element is greatly and adversely effected and the rate of finished products is reduced.

SUMMARY OF THE INVENTION

In view of the above problems, an object of the present invention is to provide a semiconductor laser. The semiconductor laser has characteristics of compact structure and simple optical path.

In order to achieve the above object, the invention provides a semiconductor laser including a substrate, and lasers, fast axis collimation components, slow axis collimation components, steering compression optical systems, a polarization beam combination prism, a focusing lens and an optical fiber provided on the substrate, wherein the lasers are arranged in two rows or one row. Lasers of the same row are all located in a same plane, each laser is sequentially provided with a fast axis collimation component and a slow axis collimation component in the direction of the optical path. Lasers of the same row correspond to a group of steering compression optical systems. The steering compression optical systems are used to steer and compress the light beams collimated by the fast axis collimation components and the slow axis collimation components. Where there are two rows of lasers, the polarization beam combination prism is used for combining two beams of lasers having been steered and compressed by two groups of the steering compression optical systems. The focusing lens and the optical fiber are sequentially arranged behind the polarization beam combination prism, and the combined laser beams are coupled into the optical fiber by the focusing lens.

The steering compression optical systems may adopt a transmission method or a reflection method.

When the steering compression optical systems adopt the transmission method, the steering compression optical systems include a transmission wedge prism and a plurality of steering mirrors. The plurality of steering mirrors correspond to the lasers of the same row respectively, the beams emitted by the respective lasers sequentially pass through the fast axis collimation components, the slow axis collimation components and the steering mirrors, and all the beams steered by the plurality of steering mirrors are compressed by the transmission wedge prism.

When the steering compression optical systems adopt the reflection method, the steering compression systems include an optical element with a reflecting surface with a tilt angle and a plurality of steering mirrors. The plurality of steering mirrors correspond to the lasers of the same row respectively, the beams emitted by the respective lasers sequentially pass through the fast axis collimation components, the slow axis collimation components and the steering mirrors, and all the beams steered by the plurality of steering mirrors are compressed by the optical element.

The steering mirrors corresponding to the respective lasers of the same row are all located in the same plane, and the tilt angles, relative to the substrate, of the respective steering mirrors located on the same plane are the same.

The tilt angles, relative to the substrate, of the respective steering mirrors located on the same plane are between 1° to 10°. The plane on which the lasers of the same row are located is higher than the plane on which the steering mirrors corresponding thereto are located.

When two rows of lasers are arranged on the substrate, the two beams of lasers having been steered and compressed by the two groups of the steering compression optical systems, when arriving at the polarization beam combination prism, are located at the same height.

The two rows of lasers can be located in the same plane or the two rows of lasers can be located in two planes having different heights, respectively.

The semiconductor laser of the present invention has the following advantages and beneficial effects:

1. According to the present invention, because the multiple lasers are located in a same horizontal plane, the thickness of the substrate can be effectively reduced and the thermal dissipation capacity of the laser can be improved, so that the efficiency and reliability of the laser are improved.

2. According to the present invention, because the multiple lasers are located and mounted in a same horizontal plane, the structure of the substrate is greatly simplified and the difficulty of the processing is reduced, which can greatly reduce the mechanical material cost.

3. According to the present invention, because the multiple lasers are located and mounted in a same horizontal plane, steps between the light beams in the direction of the fast axis are produced by the reflecting mirrors with a specific tilt angle, then change of the spacing of the light beams in the direction of the fast axis can be easily achieved by adjusting the angle of the reflecting mirror so as to fit for semiconductor lasers with different characteristics. The versatility of the mechanical materials are thus increased and the cost of the management and production are greatly reduced.

4. The present invention relates to a steering compression optical system and this system can be either a transmission method or a reflection method. A steering compression system employing the transmission method is comprised of steering mirrors and a transmission wedge prism such as a rectangular wedge prism; and a steering compression system using the reflection method is comprised of steering mirrors and an optical element with a reflective surface having a specific tilt angle such as a right angle inclined reflective prism. This allows two adjacent laser beams to have a greater spacing when passing through the reflecting mirror, reduce the difficulty of the adjustment of the step spacing and increase the rate of the finished products.

Figure 1:
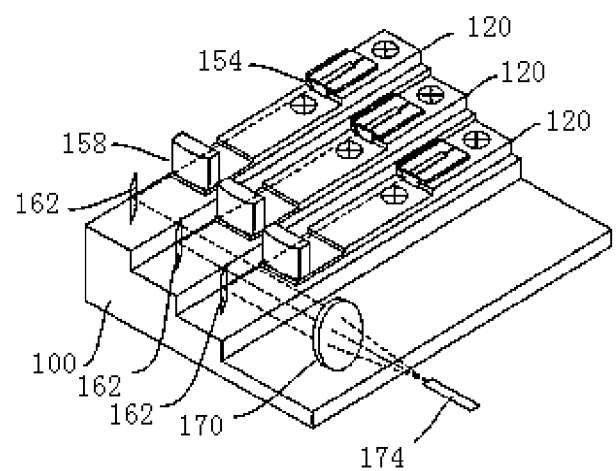
FIG. 1 is a schematic view of the structure of a conventional laser.

In the drawings, reference numerals are specified as: 100 (or 200, or 300): a substrate, 120: a laser, 135: a rhombic prism, 140: a steering prism, 142: a polarization beam combination prism, 154: a fast axis collimation component, 158: a slow axis collimation component, 162: a steering mirror, 166: a steering rectangular wedge prism, 167: a common reflecting mirror, 168: an inclined reflection prism, 170: a focusing lens, 174: an optical fiber. 120.1: a first laser, 120.2: a second laser, 120.3: a third laser, 154.1: a first fast axis collimation component, 154.2: a second fast axis collimation component, 154.3: a third fast axis collimation component, 130.1: a first light beam, 130.2: a second light beam, 130.3: a third light beam, 158.1: a first slow axis collimation component, 158.2: a second slow axis collimation component, 158.3: a third slow axis collimation component, 162.1: a first steering mirror, 162.2: a second steering mirror, 162.3: a third steering mirror, 130c: a light beam stack.

DETAILED DESCRIPTION OF THE INVENTION

The present invention will be further described in detail in connection with the drawings and embodiments as below.

As shown in FIG. 2a-6c, the present invention provides a semiconductor laser including a substrate 100 (200,300) and lasers 120, fast axis collimation components 154, slow axis collimation components 158, steering compression optical systems, a polarization beam combination prism 142, a focusing lens 170 and an optical fiber 174 arranged on the substrate 100, wherein the lasers 120 are arranged in two rows or one row and the lasers 120 of the same row are all located in the same plane. Each laser 120 is sequentially provided with a fast axis collimation component 154 and a slow axis collimation component 158 in the direction of the optical path. The lasers 120 of the same row correspond to a group of steering compression optical systems. The steering compression optical systems are used to steer and compress the light beams collimated by the fast axis collimation components 154 and the slow axis collimation components 158. Where there are two rows of lasers, the polarization beam combination prism 142 is used to combine two beams of lasers steered and compressed by two groups of the steering compression optical systems. The focusing lens 170 and the optical fiber 174 are sequentially arranged behind the polarization beam combination prism 142, and the laser beams combined by the polarization beam combination prism 142 will be coupled into the optical fiber 174 by the focusing lens 170.

The steering compression optical systems adopt a transmission method or a reflection method. When the steering compression optical systems adopt the transmission method, the steering compression optical systems include a transmission wedge prism 166 and a plurality of steering mirrors 162. The plurality of steering mirrors 162 correspond to the respective lasers 120 of the same row respectively. The beams emitted by the respective lasers 120 sequentially pass through the fast axis collimation components 154, the slow axis collimation components 158 and the steering mirrors 162. And the beams steered by the plurality of steering mirrors 162 are all compressed by the transmission wedge prism. A rectangular wedge prism 166 can be used as the transmission wedge prism.

When the steering compression optical systems adopt the reflection method, the steering compression systems include an optical element with a reflecting surface with a tilt angle 168 and a plurality of steering mirrors 162. The plurality of steering mirrors 162 correspond to the lasers 120 of the same row respectively. The beams emitted by the respective lasers 120 sequentially pass through the fast axis collimation components 154, the slow axis collimation components 158 and the steering mirrors 162. The beams steered by the plurality of steering mirrors 162 are all compressed by the optical element. An inclined reflection prism 168 can be used as the optical element.

Two beams of lasers steered and compressed by the two groups of the steering compression optical systems, when arriving at the polarization beam combination prism, are at the same height.

The substrate 100 (or 200, or 300) has a stepped structure. The steering mirrors 162 corresponding to the respective lasers 120 located in the same row are all located in the same horizontal plane, and the tilt angles, relative to the substrate 100, of the respective steering mirrors 162 are the same. The tilt angles of the steering mirrors 162 relative to the substrate 100 (or 200, or 300) are between 1° to 10°. The plane in which the lasers 120 of the same row are located is higher than the plane in which the steering mirrors 162 corresponding thereto are located. And the polarization beam combination prism 142, the focusing lens 170 and the optical fiber 174 are located in the same plane.

Figure 7:
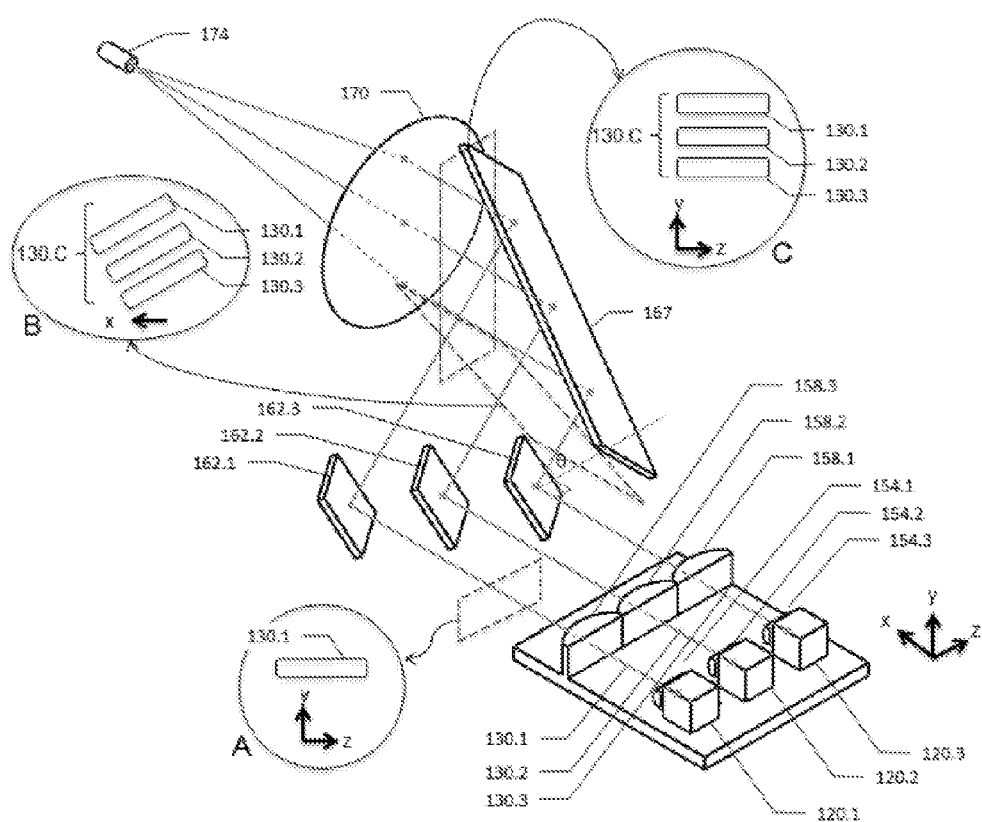
FIG. 7 is a schematic diagram of the principle of the present invention.

The working principle of the present invention is as follows:

As shown in FIG. 7, the present invention provides a compact structure of a planar shape in which a plurality of semiconductor lasers 120 are mounted in the same horizontal plane. Beams 130 emitted by the plurality of semiconductor lasers 120 propagate along the x direction. The beams 130 are collimated in the fast axis and the slow axis directions and steered by the steering mirrors 162 tilted in a specific angle to form a beam stack which propagates in a designed angle (the propagation direction is parallel to the yz plane). The beam stack is steered by a common reflecting mirror 167 tilted in a specific angle, and the beam stack 130C propagates along the x direction and is focused and coupled by a coupling lens 170 into the optical fiber 174.

The common reflecting mirror 167 and the steering mirrors 162 tilted in a specific angle form an optical system which has a compression effect to the beam stack 130 in the direction of the fast axis, which allows the spacings of the respective spots in the direction of the fast axis to be appropriately enlarged when being steered by the steering mirrors 162. The difficulty of the adjusting are thus reduced and the rate of the finished products are increased. The common reflecting mirror 167 can also be an inclined reflection prism or a transmission wedge prism. The combination of this kind of structure with the technology of polarization beam combination enable the realization of a laser having a higher power output.

The spacing between two adjacent laser beams in the direction of the fast axis is $d=L*\sin\theta$, where L is the center spacing of the two adjacent semiconductor lasers and $\theta$ is the tilt angle of a single laser beam relative to the plane of the substrate.

The rectangular wedge prism satisfies: $n0\ \sin(\theta+\alpha)=n1\ \sin\alpha$, where a is the apex angle of the rectangular wedge prism, $\theta$ is the tilt angle of a single laser beam relative to the plane of the substrate, n0 is the refractive index of the air and n1 is the refractive index of the rectangular wedge prism.

Embodiment 1

Figure 2A:
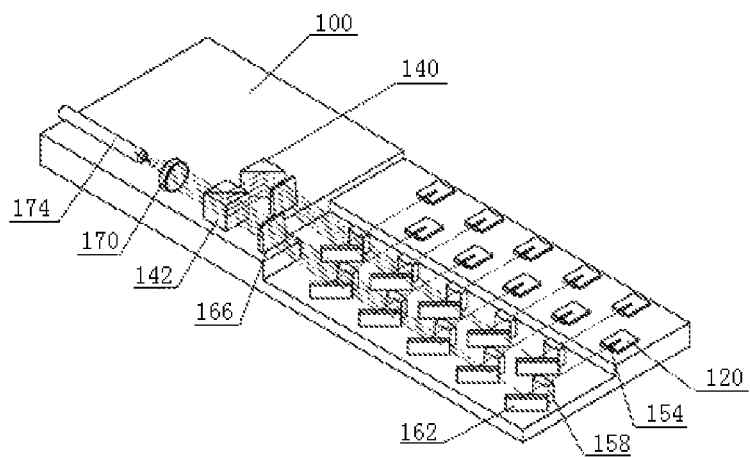
FIG. 2a is a perspective view of the structure of Embodiment 1 of the present invention.
Figure 2B:
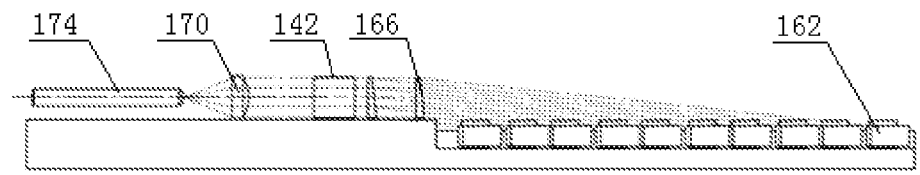
FIG. 2b is a side view of Embodiment 1 of the present invention.
Figure 2C:
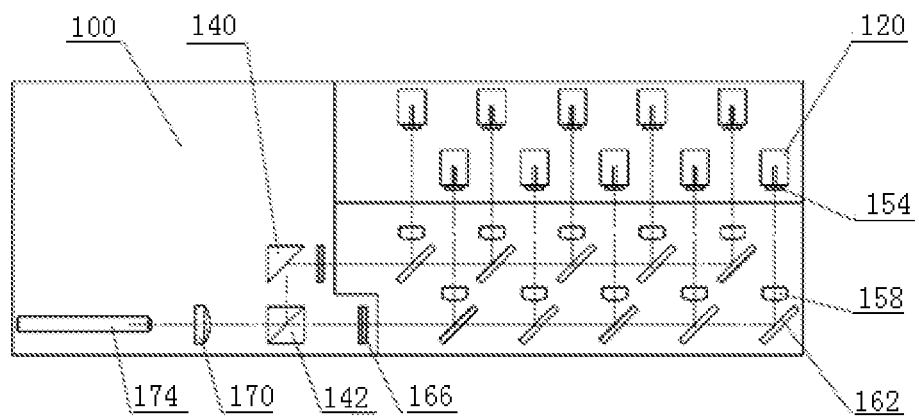
FIG. 2c is a top view of Embodiment 1 of the present invention.

The present invention relates to a fiber-coupled laser, as shown in FIG. 2a-2c, including a substrate 100, two rows of lasers 120, a plurality of fast axis collimation components 154, a plurality of slow axis collimation components 158, a plurality of steering mirrors 162, a steering rectangular wedge prism 166, a steering prism 140, a polarization beam combination prism 142, a focusing lens 170 and a coupling optical fiber 174. The steering compression optical systems are the combinations of the steering mirrors 162 with the steering rectangular wedge prism 166. The laser beams outputted by the plurality of lasers 120, after being collimated and combined, are coupled into the optical fiber 174, and then outputted.

In the present embodiment, the substrate 100 is made of a material of high thermal conductivity such as oxygen-free copper. As shown in FIG. 2a-2c, there are three planes of different heights on the substrate 100 which are respectively used for carrying the lasers 120 and the optical elements. The plane on the substrate 100 in which the two rows of lasers 120 are welded is a plane of the same height, which ensures that the plurality of lasers 120 have the same thermal dissipation capacity. The two rows of lasers 120 are located on the same side of the substrate 100. All of the lasers 120 are located in the same horizontal plane, and the two rows of lasers 120 are staggered. The spacings d2 of the front cavity surfaces of two groups of LDs (lasers) are fixed, letting the center spacing of the two adjacent LDs in the same row be d1 and the divergence half-angle of the slow axis of the tube core be $\theta1$, wherein $d1>2*d2 tg\theta1$. In the two rows of lasers 120, each laser is collimated by the fast axis collimation component 154 and the slow axis collimation component 158 corresponding thereto in the directions of the fast axis and the slow axis, then steered and compressed by the reflecting mirrors 162 and the rectangular wedge prism 166, to form two beams of parallel lasers located in the same height. If all of the reflecting mirrors 162 are tilted upward in the same angle, an equally spaced distribution is formed between the respective beams of laser in the direction of the fast axis. The spacing d of the two adjacent beams of lasers should be larger than the maximal size of the laser in the direction of the fast axis after passing through the fast axis collimation components 154. $d=L*\sin\theta$, where L is the center spacing of the two adjacent semiconductor lasers and $\theta$ is the tilt angle of a single laser beam relative to the plane of the substrate. The rectangular wedge prism satisfies $n0\ \sin(\theta+\alpha)=n1\ \sin\alpha$, where a is the apex angle of the rectangular wedge prism, $\theta$ is the tilt angle of a single laser beam relative to the plane of the substrate, n0 is the refractive index of the air and n1 is the refractive index of the rectangular wedge prism.

The polarization beam combination prism 142 is used for combining two beams of lasers. The two beams of lasers are at the same height, one beam of which passes through a steering rectangular prism and passes through the upper wave plate of the polarization beam combination prism 142 to change the polarization state. The other beam of which directly goes into the prism without passing through the wave plate. Thus, the two beams are combined by the polarization beam combination prism 142 to form one beam of laser, which is coupled into the optical fiber 174 through the focusing lens 170.

Embodiment 2

Figure 3A:
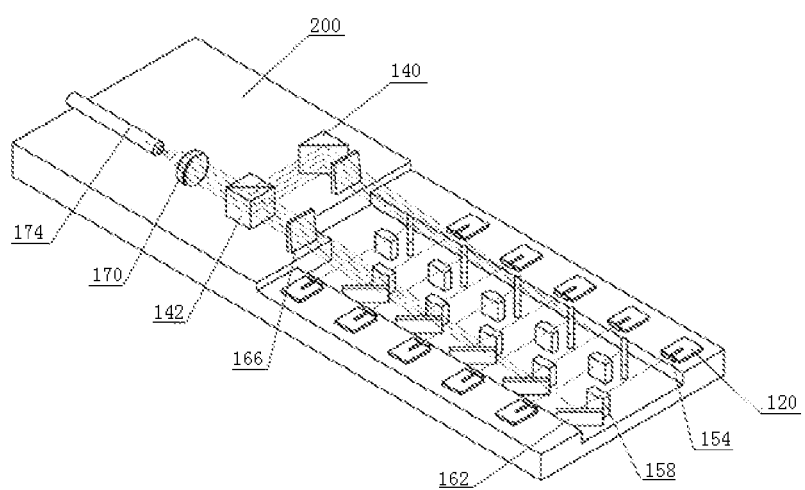
FIG. 3a is a perspective view of the structure of Embodiment 2 of the present invention.
Figure 3B:
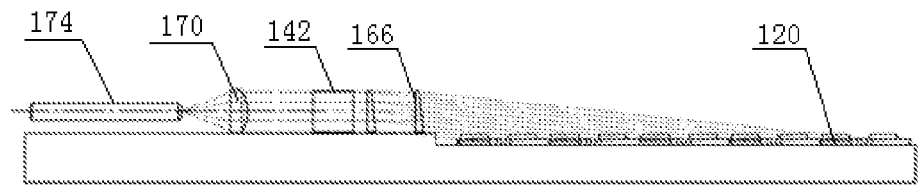
FIG. 3b is a side view of Embodiment 2 of the present invention.
Figure 3C:
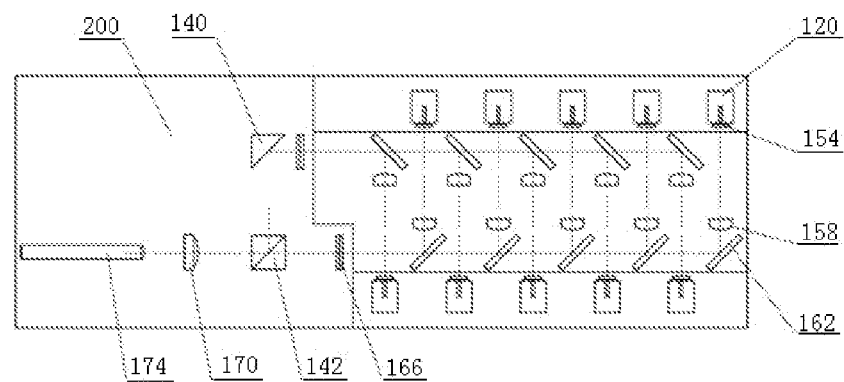
FIG. 3c is a top view of Embodiment 2 of the present invention.

The structure of the present embodiment is substantially the same as that of the Embodiment 1, except that the two rows of LDs are relatively crossed and welded at two opposite sides of the substrate 200 and all of the LDs are located in the same horizontal plane, as shown in FIG. 3a-3c.

Embodiment 3

Figure 4A:
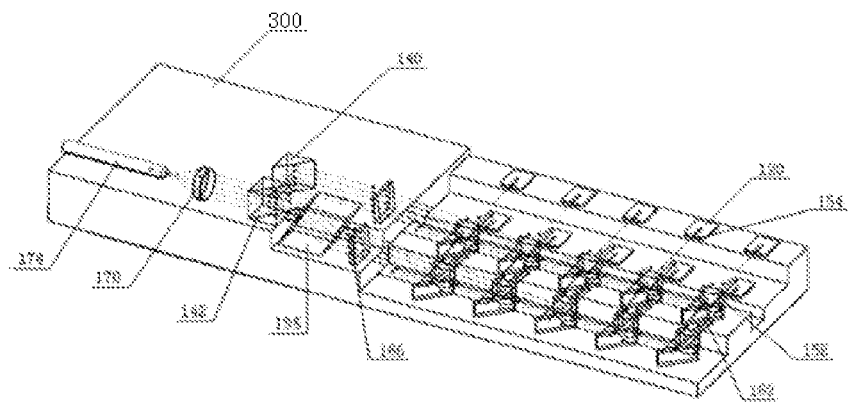
FIG. 4a is a perspective view of the structure of Embodiment 3 of the present invention.
Figure 4B:
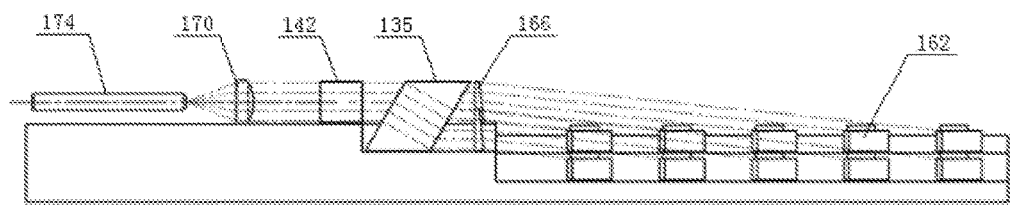
FIG. 4b is a side view of Embodiment 3 of the present invention.
Figure 4C:
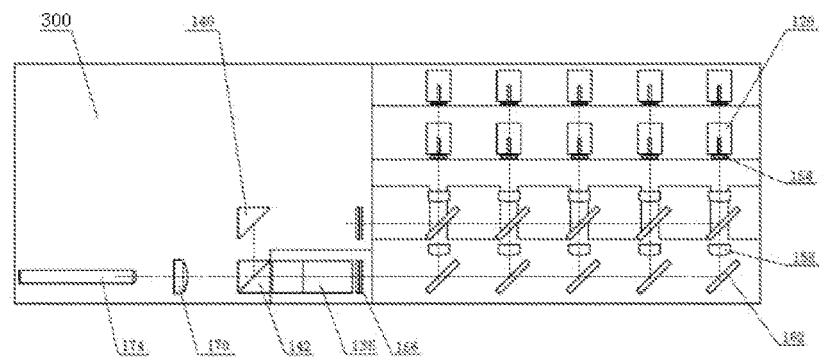
FIG. 4c is a top view of Embodiment 3 of the present invention.

Two rows of lasers 120 are located in different planes, each row of emitters is located in the same horizontal plane, and there is a specific spacing d2 in heights between two rows. The steering compression optical systems are formed by the combinations of the steering mirrors 162 and a rhombic prism 135. The rhombic prism 135 lifts the beams emitted by the lower row of lasers 120, ensuring that the two beams of laser, after being steered and compressed, have the same height when arriving at the polarization beam combination prism 142, as shown in FIG. 4a-4c.

Embodiment 4

Figure 5A:
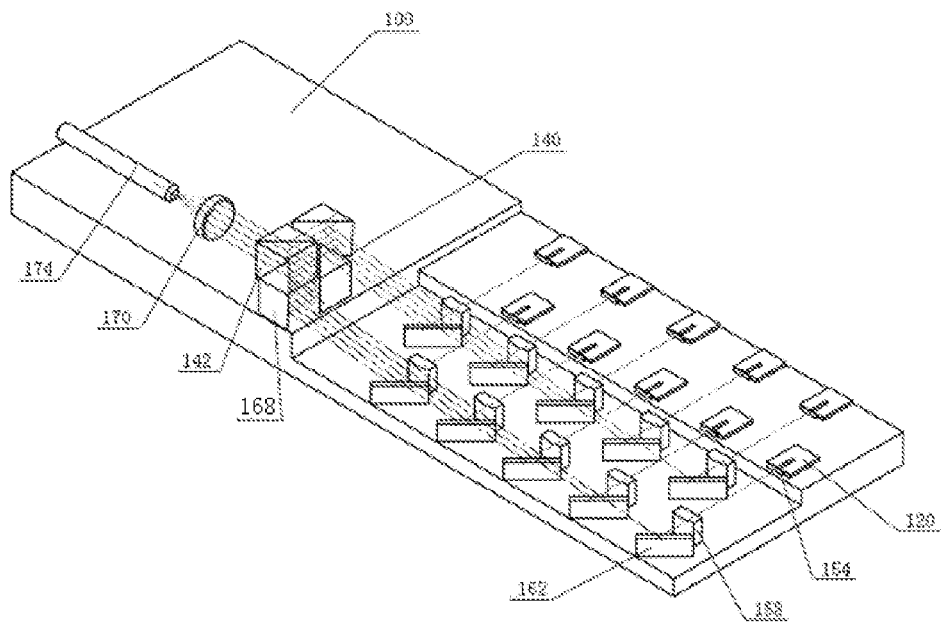
FIG. 5a is a perspective view of the structure of Embodiment 4 of the present invention.
Figure 5B:
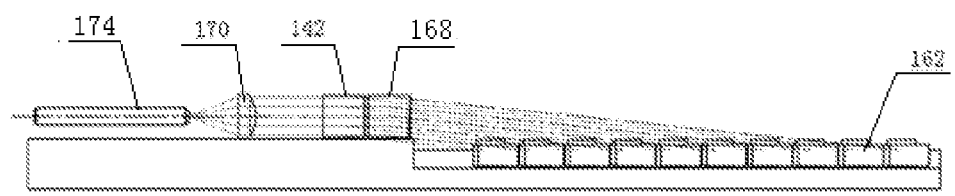
FIG. 5b is a side view of Embodiment 4 of the present invention.
Figure 5C:
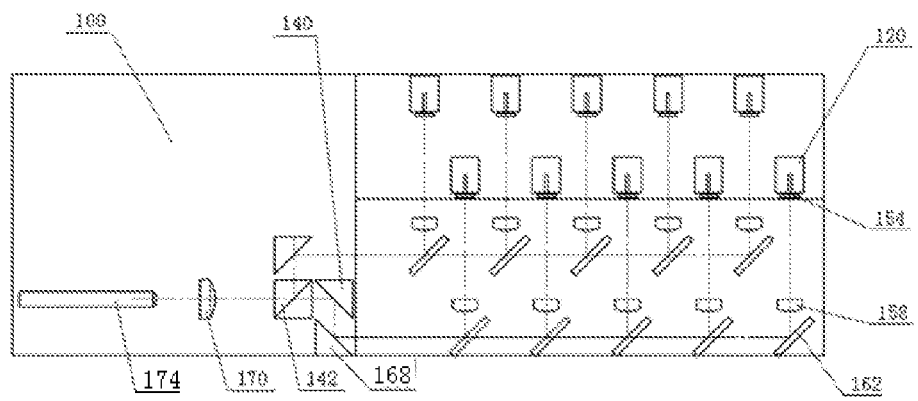
FIG. 5c is a top view of Embodiment 4 of the present invention.

Two rows of lasers 120 are located in the same plane. And the steering compression optical systems are formed by the combinations of the steering mirrors 162 and an inclined reflection prism 168, as shown in FIG. 5a-5c.

Embodiment 5

Figure 6A:
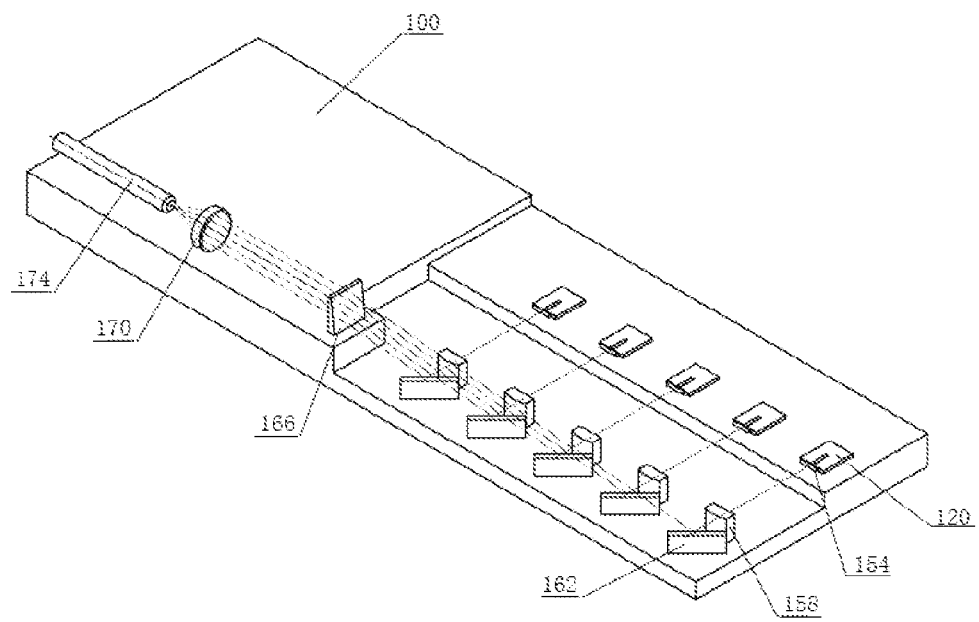
FIG. 6a is a perspective view of the structure of Embodiment 5 of the present invention.
Figure 6B:
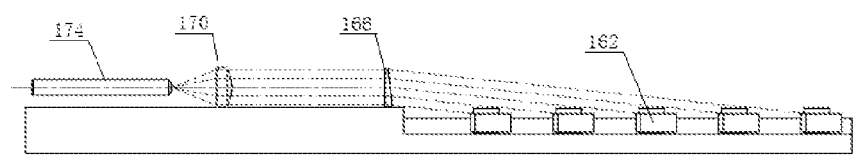
FIG. 6b is a side view of Embodiment 5 of the present invention.
Figure 6:
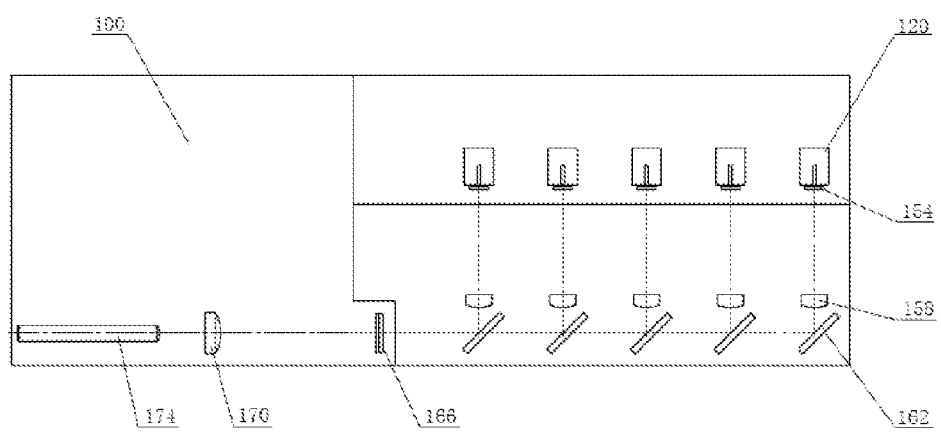
FIG. 6c is a top view of Embodiment 5 of the present invention.

Lasers 120 can also be arranged in a single row and are located in the same plane. And the steering compression optical systems are formed by the combinations of the steering mirrors 162 and a rectangular wedge prism 166, as shown in FIG. 6a-6c.

The above scheme of the present invention has the following advantages and beneficial effects:

1. According to the present invention, because the multiple lasers are located in a same horizontal plane, the thickness of the substrate can be effectively reduced and the thermal dissipation capacity of the laser can be improved, so that the efficiency and reliability of the laser are improved.

2. According to the present invention, because the multiple lasers are located and mounted in a same horizontal plane, the structure of the substrate is greatly simplified and the difficulty of the processing is reduced, which can greatly reduce the mechanical material cost.

3. According to the present invention, because the multiple lasers are located and mounted in a same horizontal plane, a step of the laser beam in a direction of the fast axis is produced by a reflecting mirror with a specific tilt angle. And change of the spacing of the light beam in the direction of the fast axis can be rapidly achieved by adjusting the angle of the reflecting mirror, which is applicable for semiconductor lasers with different characteristics, increase the versatility of the mechanical materials and greatly reduce the cost of the management and production.

4. The present invention relates to a steering compression optical system, and this system adopts either a transmission method or a reflection method. The transmission method steering compression systems are comprised of single emitter steering mirrors and a transmission wedge prism such as a rectangular wedge prism; and the reflection method steering compression systems are comprised of single emitter steering mirrors and an optical element with a reflective surface having a specific tilt angle such as a right angle inclined reflective prism. This allows two adjacent lasers to have a greater spacing when passing through the reflecting mirror, reducing the difficulty of the adjustment of the step spacing and increasing the rate of the finished products.

The invention claimed is:

1. A semiconductor laser, comprising
a substrate, and lasers,
fast axis collimation components,
slow axis collimation components,
steering compression optical systems, a polarization beam combination prism,
a focusing lens and an optical fiber provided on the substrate,
wherein the lasers are arranged in two rows or one row, and the lasers of the same row are all located in a same plane, each laser is sequentially provided with a fast axis collimation component and a slow axis collimation component in the direction of an optical path, the lasers of the same row corresponds to a group of steering compression optical systems, the steering compression optical systems are used to steer and compress the light beams collimated by the fast axis collimation components and the slow axis collimation components, when the polarization beam combination prism is used for the two rows of lasers, two beams of lasers having been steered and compressed by two groups of the steering compression optical systems are combined, the focusing lens and the optical fiber are sequentially arranged behind the polarization beam combination prism, and the lasers are coupled into the optical fiber by the focusing lens;
wherein the steering compression optical systems adopt a transmission method or a reflection method;
when the steering compression optical systems adopt the transmission method, the steering compression optical systems include a transmission wedge prism and a plurality of steering mirrors, the plurality of steering mirrors corresponding to the respective lasers of the same row respectively, the beams emitted by the respective lasers sequentially passing through the fast axis collimation components, the slow axis collimation components and the steering mirrors, and the beams steered by the plurality of steering mirrors being all compressed by the transmission wedge prism.

2. A semiconductor laser, comprising
a substrate, and lasers,
fast axis collimation components,
slow axis collimation components,
steering compression optical systems, a polarization beam combination prism,
a focusing lens and an optical fiber provided on the substrate,
wherein the lasers are arranged in two rows or one row, and the lasers of the same row are all located in a same plane, each laser is sequentially provided with a fast axis collimation component and a slow axis collimation component in the direction of an optical path, the lasers of the same row corresponds to a group of steering compression optical systems, the steering compression optical systems are used to steer and compress the light beams collimated by the fast axis collimation components and the slow axis collimation components, when the polarization beam combination prism is used for the two rows of lasers, two beams of lasers having been steered and compressed by two groups of the steering compression optical systems are combined, the focusing lens and the optical fiber are sequentially arranged behind the polarization beam combination prism, and the lasers are coupled into the optical fiber by the focusing lens;
wherein the steering compression optical systems adopt a transmission method or a reflection method;
when the steering compression optical systems adopt the reflection method, the steering compression systems include an optical element with a reflecting surface having a tilt angle and a plurality of steering mirrors, the plurality of steering mirrors corresponding to the respective lasers of the same row respectively, the beams emitted by the respective lasers sequentially passing through the fast axis collimation components, the slow axis collimation components and the steering mirrors, and the beams steered by the plurality of steering mirrors being all compressed by the optical element.

3. The semiconductor laser according to claim 1, wherein the steering mirrors corresponding to the respective lasers of the same row are all located in the same plane.

4. The semiconductor laser according to claim 3, wherein the tilt angles, relative to the substrate, of the respective steering mirrors located on the same plane are the same.

5. The semiconductor laser according to claim 4, wherein the tilt angles of the respective steering mirrors located on the same plane are between 1° to 10°.

6. The semiconductor laser according to claim 3, wherein the plane on which the lasers of the same row are located is higher than the plane on which the steering mirrors corresponding thereto are located.

7. The semiconductor laser according to claim 1, wherein when two rows of lasers are arranged on the substrate, the two beams of lasers having been steered and compressed by the two groups of the steering compression optical systems, when arriving at the polarization beam combination prism, are located at the same height.

8. The semiconductor laser according to claim 7, wherein the two rows of lasers can be located in the same plane or the two rows of lasers can be located in two planes having different heights, respectively.

9. The semiconductor laser according to claim 2, wherein the steering mirrors corresponding to the respective lasers of the same row are all located in the same plane.

10. The semiconductor laser according to claim 2, wherein when two rows of lasers are arranged on the substrate, the two beams of lasers having been steered and compressed by the two groups of the steering compression optical systems, when arriving at the polarization beam combination prism, are located at the same height.

* * * * *